(12) United States Patent
Horio et al.

(10) Patent No.: US 10,976,011 B2
(45) Date of Patent: Apr. 13, 2021

(54) LED LIGHTING APPARATUS

(71) Applicant: ROHM CO., LTD., Kyoto (JP)

(72) Inventors: Tomoharu Horio, Kyoto (JP); Teruki Ono, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/849,472

(22) Filed: Apr. 15, 2020

(65) Prior Publication Data

US 2020/0240591 A1 Jul. 30, 2020

Related U.S. Application Data

(63) Continuation of application No. 15/854,153, filed on Dec. 26, 2017, now Pat. No. 10,655,793, which is a (Continued)

(30) Foreign Application Priority Data

Sep. 26, 2012 (JP) .................................. 2012-211724

(51) Int. Cl.
*F21K 9/232* (2016.01)
*H01L 25/075* (2006.01)
(Continued)

(52) U.S. Cl.
CPC ............. *F21K 9/232* (2016.08); *F21V 15/00* (2013.01); *F21V 23/002* (2013.01); (Continued)

(58) Field of Classification Search
CPC .......... F21K 9/232; F21K 9/238; F21V 15/00; F21V 23/002; F21V 29/74; F21V 29/89; F21V 3/02; F21V 23/006; H01L 25/0753; H01L 33/644; H01L 2224/48137; H01L 2224/48465; H01L 2224/48471; H01L 2224/4945; H01L 2224/73265; H01L 2224/8592; H01L 2924/181; H05K 3/282; H05K 1/0373; H05K 2201/0162; H05K 2201/2054; F21Y 2105/10; F21Y 2115/10; F21S 8/026

See application file for complete search history.

(56) References Cited

U.S. PATENT DOCUMENTS 7,919,339 B2  4/2011 Hsu
8,324,789 B2  12/2012 Hisayasu et al.
(Continued)

FOREIGN PATENT DOCUMENTS

JP     2011-070972     4/2011

*Primary Examiner* — Bao Q Truong
(74) *Attorney, Agent, or Firm* — Hamre, Schumann, Mueller & Larson, P.C.

(57) ABSTRACT

An LED lighting apparatus is disclosed. The LED lighting apparatus includes a substrate having a first surface; at least one connection body formed by LED chips arranged side by side in a first direction over the first surface of the substrate; and a circular protruding portion, arranged over the first surface of the substrate, surrounding the plurality of LED chips. The LED lighting apparatus further includes a first wiring pattern, arranged over the first surface of the substrate; and a second wiring pattern, arranged over the first surface of the substrate and spaced apart from the first wiring pattern.

13 Claims, 12 Drawing Sheets

Related U.S. Application Data continuation of application No. 14/946,012, filed on Nov. 19, 2015, now Pat. No. 9,863,584, which is a continuation of application No. 14/037,614, filed on Sep. 26, 2013, now Pat. No. 9,222,625.

(51) Int. Cl.

| | | |
|---|---|---|
| *H05K 3/28* | (2006.01) | |
| *F21V 15/00* | (2015.01) | |
| *F21V 23/00* | (2015.01) | |
| *F21V 29/74* | (2015.01) | |
| *F21V 29/89* | (2015.01) | |
| *F21Y 105/10* | (2016.01) | |
| *F21Y 115/10* | (2016.01) | |
| *F21K 9/238* | (2016.01) | |
| *F21S 8/02* | (2006.01) | |
| *F21V 3/02* | (2006.01) | |
| *H01L 33/64* | (2010.01) | |
| *H05K 1/03* | (2006.01) | |

(52) U.S. Cl.
CPC ......... *H01L 25/0753* (2013.01); *H05K 3/282* (2013.01); *F21K 9/238* (2016.08); *F21S 8/026* (2013.01); *F21V 3/02* (2013.01); *F21V 23/006* (2013.01); *F21V 29/74* (2015.01); *F21V 29/89* (2015.01); *F21Y 2105/10* (2016.08); *F21Y 2115/10* (2016.08); *H01L 33/644* (2013.01); *H01L 2224/48137* (2013.01); *H01L 2224/48465* (2013.01); *H01L 2224/48471* (2013.01); *H01L 2224/4945* (2013.01); *H01L 2224/73265* (2013.01); *H01L 2224/8592* (2013.01); *H01L 2924/181* (2013.01); *H05K 1/0373* (2013.01); *H05K 2201/0162* (2013.01); *H05K 2201/2054* (2013.01)

(56) References Cited

U.S. PATENT DOCUMENTS

| | | | |
|---|---|---|---|
| 8,415,693 B2 | 4/2013 | Inobe et al. | |
| 8,507,047 B2 | 8/2013 | Hardinger et al. | |
| 8,648,373 B2 | 2/2014 | Toyama | |
| 9,018,832 B2 * | 4/2015 | Agatani | H01L 33/54 |
| | | | 313/500 |
| 9,461,023 B2 | 10/2016 | West | |
| 10,655,793 B2 * | 5/2020 | Horio | F21K 9/232 |
| 2009/0050907 A1 | 2/2009 | Yuan et al. | |
| 2011/0303927 A1 | 12/2011 | Sanpei | |
| 2012/0014110 A1 | 1/2012 | Sanpei | |
| 2012/0112227 A1 | 5/2012 | Toyama | |
| 2013/0105837 A1 | 5/2013 | West | |

* cited by examiner

LED LIGHTING APPARATUS

CROSS-REFERENCE TO RELATED APPLICATION

This application is a Continuation of application Ser. No. 15/584,153, filed Dec. 26, 2017, which is a continuation of application Ser. No. 14/946,012, filed Nov. 19, 2015 (now U.S. Pat. No. 9,863,584, issued Jan. 9, 2018), which is a Continuation of application Ser. No. 14/037,614, filed Sep. 26, 2013 (now U.S. Pat. No. 9,222,625, issued Dec. 29, 2015), which is based upon and claims the benefit of priority from Japanese Patent Application No. 2012-211724, filed on Sep. 26, 2012, the entire contents of which are incorporated herein by reference.

TECHNICAL FIELD

The present disclosure relates to an LED (Light Emitting Diode) lighting apparatus.

BACKGROUND

A LED lighting apparatus including a LED chip as a light source has become popular. The LED lighting apparatus may include a plurality of LED chips arranged in a plane on a board, and a translucent cover covering these LED chips. The cover is configured to diffuse and transmit light emitted from the LED chips to the outside of the LED lighting apparatus.

The LED lighting apparatus may be used as a substitution for conventional light bulbs. Further, the LED lighting apparatus is intended to provide substantially the same brightness as the conventional light bulbs and to have a higher power saving quality than the conventional light bulbs. Accordingly, it is important to allow the light from the LED chips to be emitted through the cover more efficiently. If the board or a wiring pattern formed on the board is damaged due to oxidation or sulfurization, the light from the LED chips may be undesirably absorbed in the board or the wiring pattern, which may reduce the brightness of the LED lighting apparatus.

SUMMARY

The present disclosure provides some embodiments of an LED lighting apparatus capable of achieving high brightness.

According to one embodiment of the present disclosure, there is provided an LED lighting apparatus. The LED lighting apparatus includes a board having a principal surface, a plurality of LED chips mounted on the principal surface of the board, and a wiring pattern which is formed on the principal surface of the board and makes electrical conduction with the plurality of LED chips. Further, the LED lighting apparatus includes a frame-like bank which is provided on the principal surface of the board and surrounds the plurality of LED chips. In this case, the wiring pattern has one or more pads having a first portion interposed between the bank and the plurality of LED chips. The LED lighting apparatus further includes a protective layer covering at least a portion of the pads.

The protective layer may contact the bank.

A top surface of the first portion of the pads, facing the same direction as the principal surface of the board, may be covered with the protective layer.

An end surface of the first portion of the pads, facing the plurality of LED chips, may be covered with the protective layer.

The pads may have a second portion interposed between the board and the bank.

The wiring pattern may have a terminal located in the outside of the bank.

The wiring pattern may have two pads with the plurality of LED chips interposed therebetween.

The wiring pattern may have only the two pads in the region surrounded by the bank.

The protective layer may have two portions covering the two pads, respectively, with the plurality of LED chips interposed therebetween.

A surface of the protective layer may be inclined to be closer to the board as the surface becomes farther away from the bank.

The protective layer may be made of a mixture of resin material and white material.

The resin material may be a silicone resin.

The white material may be a titanium oxide.

The protective layer may be made of glass.

The LED lighting apparatus may further include a glass layer interposed between the bank and the plurality of LED chips, wherein an edge of the protective layer facing the plurality of LED chips overlaps with the glass layer.

The LED chips may be bare chips directly bonded to the principal surface.

Adjacent ones of the LED chips may be interconnected by a wire.

One of the plurality of LED chips may be connected to the pads by a wire.

The LED lighting apparatus may further include a sealing resin covering the plurality of LED chips and the protective layer in a space surrounded by the bank.

The sealing resin is mixed with fluorescent material emitting light having a wavelength different from a wavelength of light from the LED chips by being excited by the light from the LED chip.

The LED lighting apparatus may include a plurality of LED modules, each having an LED chip, fluorescent resin covering the LED chip, and a mounting terminal.

The board may be made of ceramics.

The board may be made of aluminum.

The wiring pattern may contain Ag.

The protective layer may be formed in an entire periphery along the bank.

The LED lighting apparatus may further include a globe transmitting light from the plurality of LED chips, and serve as an LED light bulb.

The LED lighting apparatus may further include a tapered reflector surrounding the plurality of LED chips, and serve as a down-light.

Other features and advantages of the present disclosure will be apparent from the following detailed description in conjunction with the accompanying drawings.

DETAILED DESCRIPTION

Figure 1:
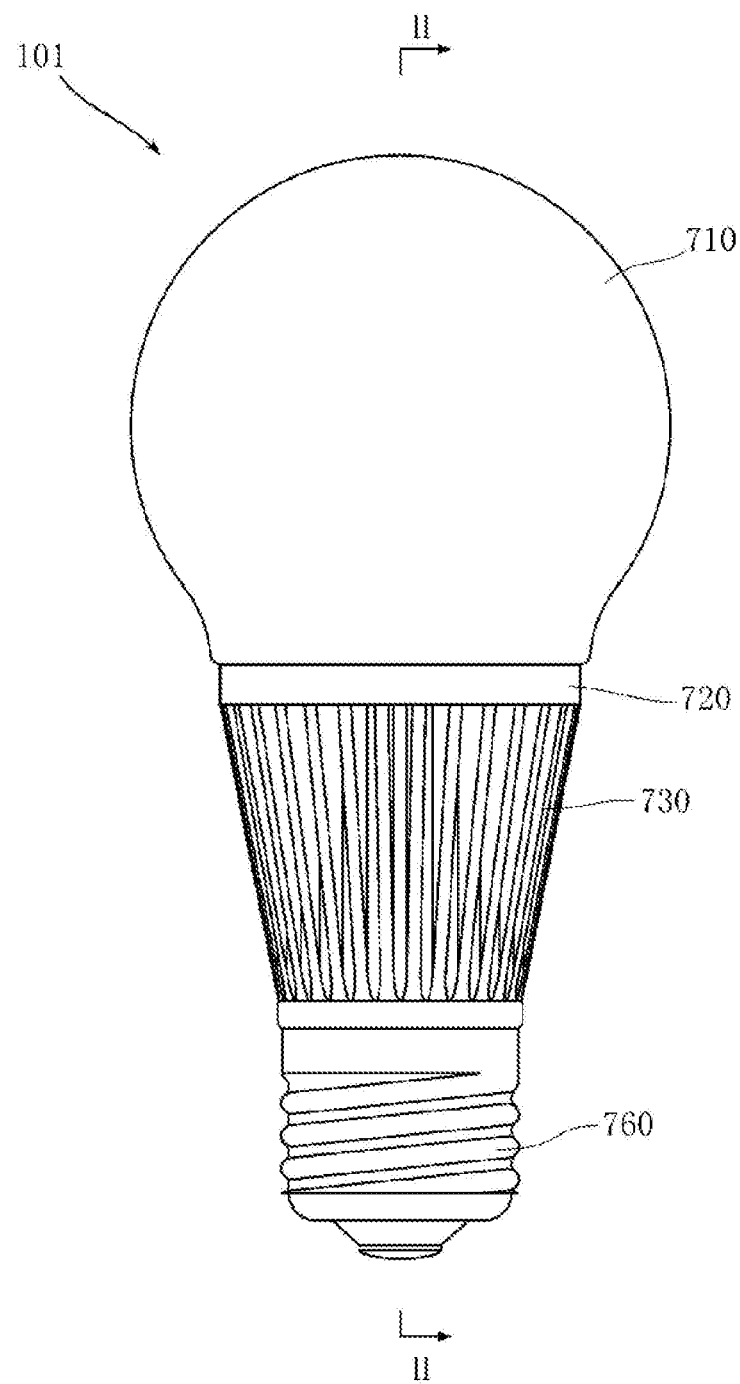
FIG. 1 is a front view showing an LED lighting apparatus according to a first embodiment of the present disclosure.
Figure 2:
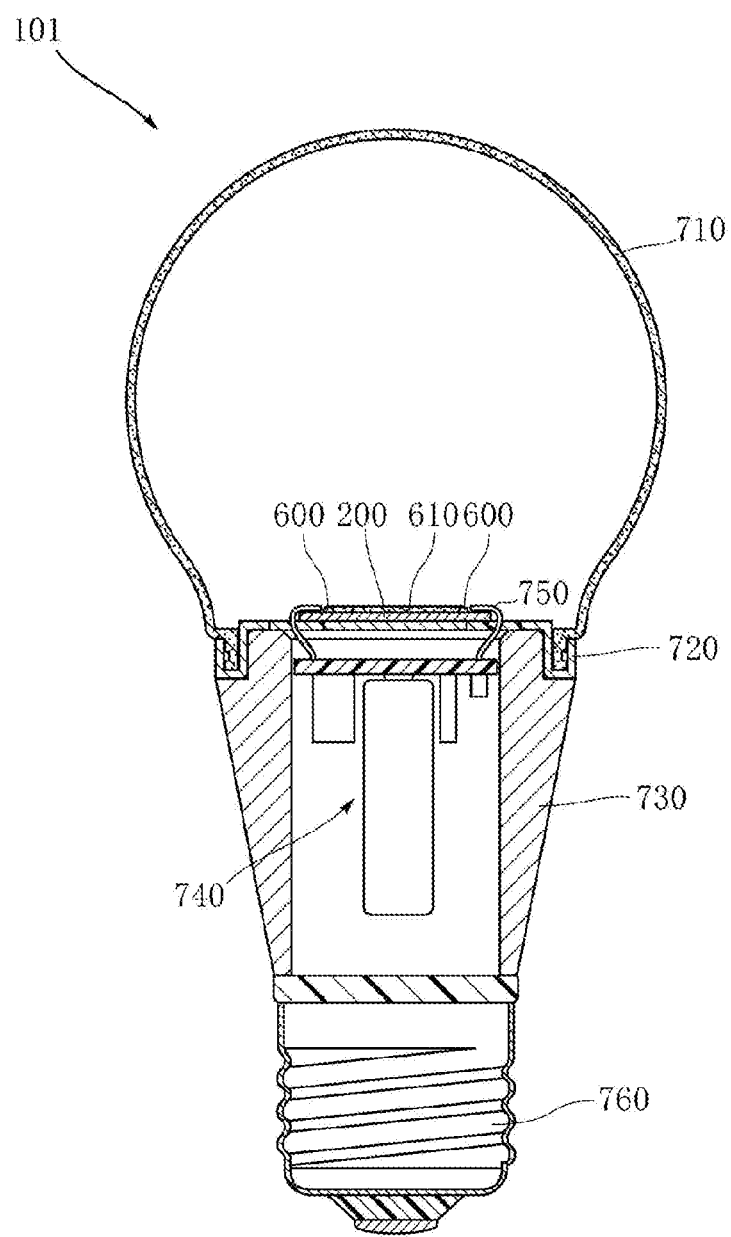
FIG. 2 is a sectional view taken along line II-II in FIG. 1.

Preferred embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrase "connection of a member A and a member B" is intended to include direct physical connection of the member A and the member B as well as indirect connection thereof via other member as long as the other member has no substantial effect on the electrical connection of the member A and the member B or has no damage to functions and effects shown by a combination of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C or has no damage to functions and effects shown by a combination of the member A, the member B and the member C.

FIGS. 1 to 6 show an LED lighting apparatus 101 according to a first embodiment of the present disclosure. The LED lighting apparatus 101 of this embodiment may be used as a substitution for conventional light bulbs. The LED lighting apparatus 101 includes a board 200, a plurality of LED chips 300, a wiring pattern 400, a protective layer 500, a bank 600, a sealing resin 610, a globe 710, a support member 720, a heat dissipation member 730, a power supply 740 and a bayonet cap 760. For convenience of understanding, the sealing resin 610 is not shown in FIG. 4.

The globe 710 accommodates the LED chips 300 in its internal space and has a spherical shell-like structure. The globe 710 is made of, for example, a translucent milky-white resin such as a polycarbonate resin mixed with a diffusing agent.

The support member 720 is made of, for example, metal such as aluminum, and supports the board 200 and the globe 710. The board 200 and the globe 710 are attached to the support member 720, for example by bonding by means of an adhesive agent or an adhesive tape. Alternatively, the board 200 and the globe 710 may be attached to the support member 720 by engaging their respective portions. The support member 720 is adhered to the heat dissipation member 730 by means of bonding, mating, bolting or the like.

The heat dissipation member 730 is made of, for example, metal such as aluminum and has substantially the cylindrical shape. The power supply 740 is accommodated in the internal space of the heat dissipation member 730. A plurality of fins for promoting heat dissipation may be formed on the external surface of the heat dissipation member 730. However, the heat dissipation member 730 may have a flat external surface without such fins.

The bayonet cap 760 is used for installing the LED lighting apparatus 101 to a socket of a typical light bulb lighting apparatus, for example in conformity to the JIS standards. In this embodiment, the bayonet cap 760 is attached to the heat dissipation member 730. Further, the bayonet cap 760 is configured to satisfy the specifications defined by the JIS standards. The bayonet cap 760 is also connected to the power supply 740 by a wiring.

Figure 3:
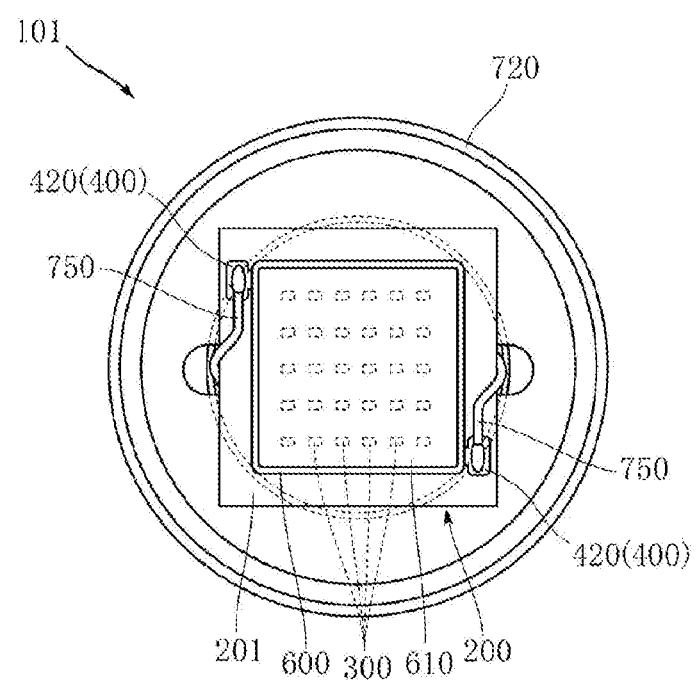
FIG. 3 is a plan view showing main parts of the LED lighting apparatus of FIG. 1.
Figure 4:
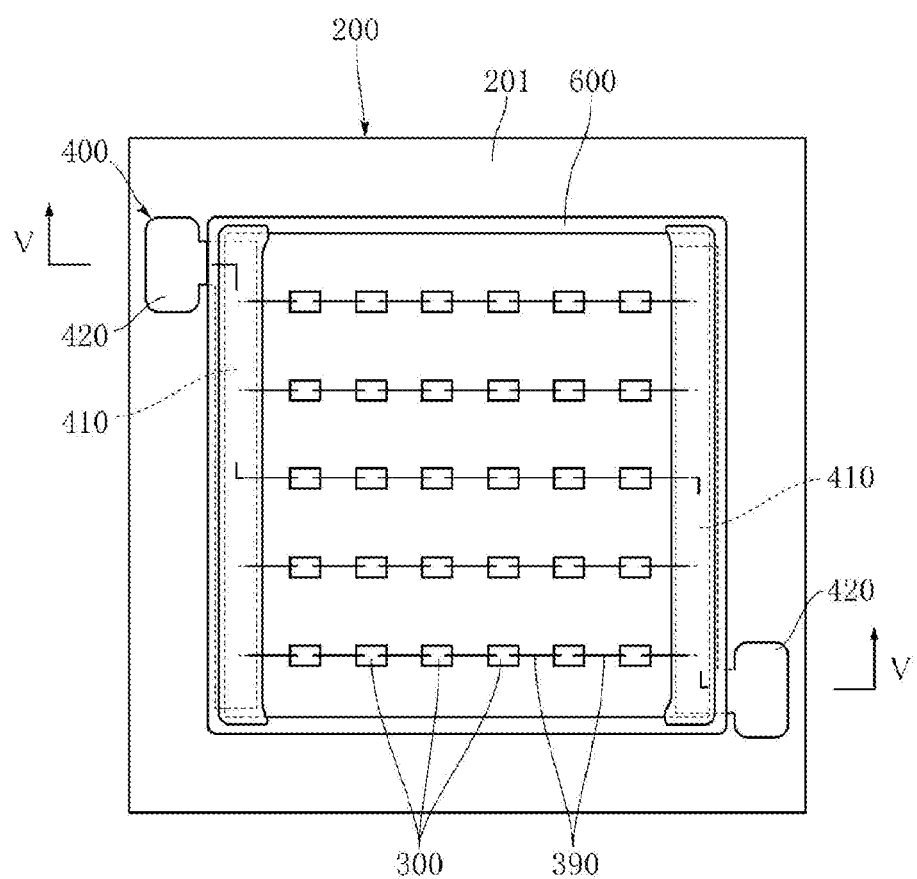
FIG. 4 is a plan view showing main parts of the LED lighting apparatus of FIG. 1.

The board 200 is made of, for example, ceramics and has a rectangular shape, for example, as shown in FIGS. 3 and 4. The thickness of the board 200 is, for example, 0.5 to 2.0 mm. The board 200 has a principal surface 201 facing the globe 710.

Figure 5:
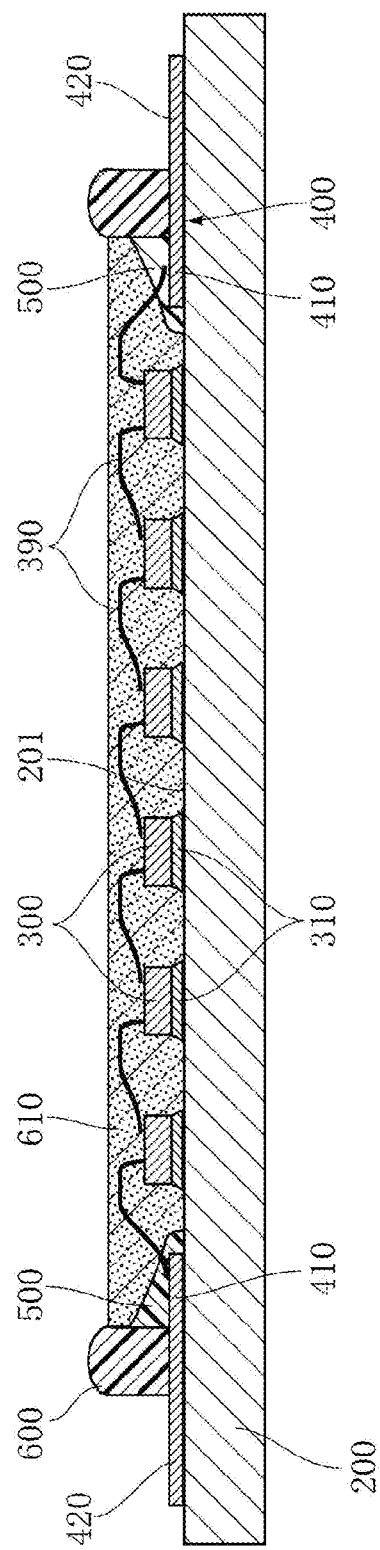
FIG. 5 is a main part sectional view taken along line V-V in FIG. 4.
Figure 6:
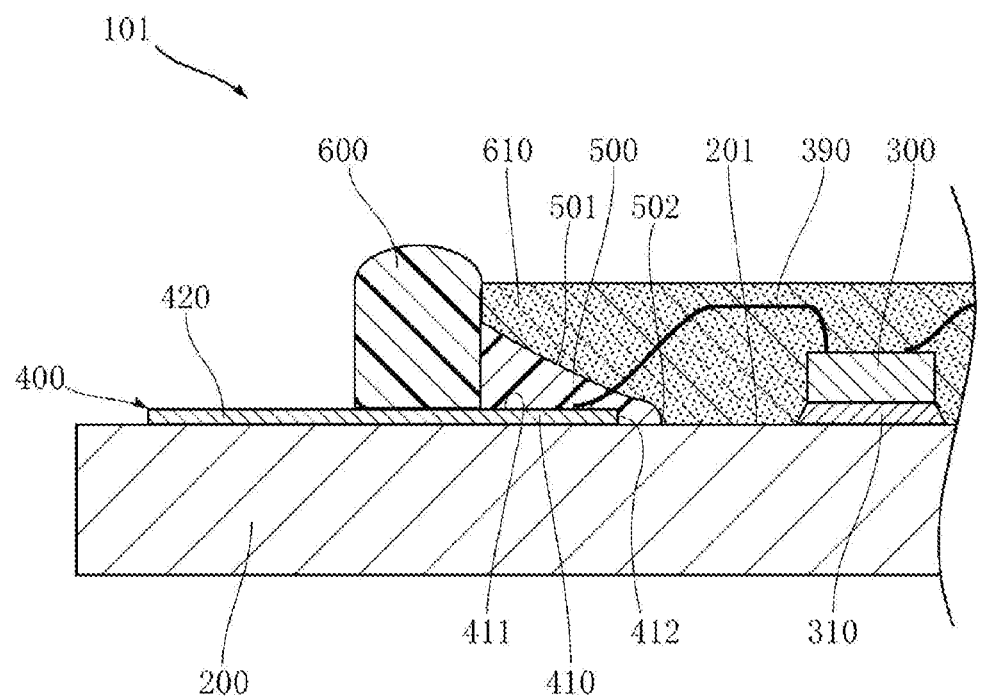
FIG. 6 is an enlarged sectional view showing main parts of the LED lighting apparatus of FIG. 1.

The LED chips 300 are arranged on the principal surface 201 of the board 200, for example in a form of a matrix and are supported by the principal surface 201. Each of the LED chips 300 is made of, for example, a GaN-based semiconductor and emits blue light, for example. In this embodiment, as shown in FIGS. 5 and 6, the LED chips 300 are directly bonded to the principal surface 201 by means of a bonding layer 310 in the form of a so-called bare chip. Further, the bonding layer 310 may be made of either a conductive material or insulating material since no electrode is formed in the bottom of the LED chips 300. Two electrodes (not shown) are formed on a top surface of each LED chip 300. Electrodes of adjacent LED chips 300 are interconnected by a wire 390. Thus, a predetermined number of LED chips 300 are connected in series.

The bank 600 is made of, for example, white silicone resin and is formed on the principal surface 201 to surround the LED chips 300. The height of the bank 600 is, for example, 0.5 to 1.0 mm. In this embodiment, the bank 600 has a rectangular frame shape.

The wiring pattern 400 is formed on the principal surface 201 of the board 200 and serves as a path for supplying power to the LED chips 300. The wiring pattern 400 is made of, for example, Ag having a thickness of about 5 to 30 μm and is a whitish or silverfish color. As an alternative, the wiring pattern 400 may have a multi-layered metallic structure including, for example, Ag/Pt, Cu/Ni/Ag, Ni/Au/Ag, Ni/Pd/Ag and the like. In this embodiment, the wiring pattern 400 has two pads 410 and two terminals 420.

The two terminals 420 are formed on the principal surface 201 outside the bank 600. The two terminals 420 are disposed with the bank 600 interposed therebetween. As shown in FIG. 3, one end of a cable 750 is, for example, soldered to each terminal 420. The cable 750 interconnects the wiring pattern 400 and the power supply 740.

As shown in FIGS. 4 to 6, the two pads 410 are formed on the principal surface 201 to face with each other with the LED chips 300 interposed therebetween. Each pad 410 has a band shape extending along a side of the bank 600. Each pad 410 has a first portion located in a region surrounded by the bank 600 and a second portion interposed between the bank 600 and the principal surface 201. In addition, in the region surrounded by the bank 600, each pad 410 has a top surface 411 facing in the same direction as the principal surface and an end surface 412 facing the LED chips 300.

Of the plurality of LED chips 300, ones adjacent to the pads 410 are connected to the pads 410 by means of wires 390. Thus, the LED chips 300 have such a configuration that multiple sets of LED chips 300 are connected in parallel, with each set including a predetermined number of LED chips 300 connected in series.

In the region surrounded by the bank 600, only two pads 410 of the wiring pattern 400 are formed. The other portions of the wiring pattern 400 are not formed in the region surrounded by the bank 600.

The protective layer 500 is made of, for example, silicone resin mixed with white material. An example of the silicone resin may include methyl-based silicone resin and phenyl-based silicone resin. An example of the white material may include titanium oxide. When the protective layer 500 is made of such mixed material, it has a relatively high reflectivity. Specifically, if a mixture ratio of the titanium oxide is about 70 to 80 wt %, the reflectivity of the protective layer 500 is about 95%. As shown in FIGS. 4 to 6, the protective layer 500 is separated into two parts covering the two pads 410, respectively. The protective layer 500 has a front surface 510 and an edge 502. The protective layer 500 is formed to cover the top surface 411 of the pads 410. In particular, in this embodiment, the entire top surface 411 is covered by the protective layer 500. That is, when viewed from the top, the top surface 411 of the pads 410 is contained in the front surface 501 of the protective layer 500. In addition, the protective layer 500 is formed to cover the end surface 412 of the pads 410. In particular, the entire end surface 412 is covered by the protective layer 500 in this embodiment. That is, when viewed from the top, the edge 502 of the protective layer 500 is located nearer to the LED chips 300 than the end surface 412 of the pads 410 over its entire length.

As shown in FIG. 5, the protective layer 500 is formed on the top surface 411 of the pads 410 to contact an inner surface of the bank 600 facing the LED chips 300. In other words, a portion of the inner surface of the bank 600 is covered by the protective layer 500. The protective layer 500 is formed by applying and firing a mixture of liquid or paste silicone resin material and white material such as titanium oxide along the inner surface of the bank 600.

The sealing resin 610 is filled in a space surrounded by the bank 600 and covers the LED chips 300, the wires 390 and the protective layer 500. The sealing resin 610 is made of, for example, a mixture of transparent silicone resin or epoxy resin and fluorescent material. An example of the fluorescent material may include materials emitting yellow light when they are excited by blue light from the LED chips 300. This allows white light to be emitted from the LED lighting apparatus 101. Another example of the fluorescent material may include a mixture of material emitting red light and material emitting green material when they are excited by blue light from the LED chips 300.

Subsequently, an operation of the LED lighting apparatus 101 will be described.

According to this embodiment, as shown in FIGS. 4 to 6, a portion of the pads 410 of the wiring pattern 400, which lies in the region surrounded by the bank 600, is covered by the protective layer 500. With this configuration, it is possible to prevent the pads 410 from being damaged due to oxidation or sulfurization. That is, it is possible to avoid absorption of light from the LED chips 300 into the pads 410, and thereby providing high brightness of the LED lighting apparatus 101.

Additionally, in this embodiment, the entire top surface 411 of the pads 410 is covered by the protective layer 500. This allows the top surface 411 to be maintained at a condition appropriate for reflection. In addition, the end surface 412 of the pads 410 is covered by the protective layer 500. With this configuration, it is possible to prevent the end surface 412 from being damaged and light from being unduly absorbed.

Titanium oxide which serves as white material is mixed in the protective layer 500. Thus, the front surface 501 of the protective layer 500 has a high reflectivity of, for example, about 95%. With this configuration, it is possible to reflect most of light directed to the protective layer 500. For example, even if a portion of the pads 410 covered by the protective layer 500 is damaged with a long term use, it is possible to prevent light from being absorbed into the damaged portion. In order to prevent the damage of the pads 41, phenyl-based silicone resin may be used as the main raw material of the protective layer 500.

When the front surface 510 of the protective layer 500 is inclined to be closer to the board 200 as it becomes farther away from the bank 600, light emitted from the LED chips 300 can be more efficiently reflected toward the outside of the LED lighting apparatus 101. When the protective layer 500 is formed on the top surface 411 of the pads 410 to contact the inner surface of the bank 600, it is easy to make the front surface 501 of the protective layer 500 inclined.

In the region surrounded by the bank 600, the wiring pattern 400 does not have a portion other than the two pads 410. Further, the board 200 is exposed in a region where the LED chips 300 are arranged. For example, the board 200 made of ceramics is less likely to be damaged and the principal surface 201 is easy to be maintained in a state having a relatively high reflectivity. Therefore, it is suitable for high brightness of the LED lighting apparatus 101.

When the LED chips 300 are configured as a so-called bare chip structure and are directly bonded to the principal surface 201 of the board 200, it is possible to transfer heat from the LED chips 300 to the board 200 more efficiently. This is suitable for supplying high power by the LED chips 300, which is advantageous for providing high brightness of the LED lighting apparatus 101.

FIGS. 7 to 16 show other embodiments of the present disclosure. Throughout these figures, the same or similar elements are denoted by the same reference numerals as the first embodiment.

Figure 7:
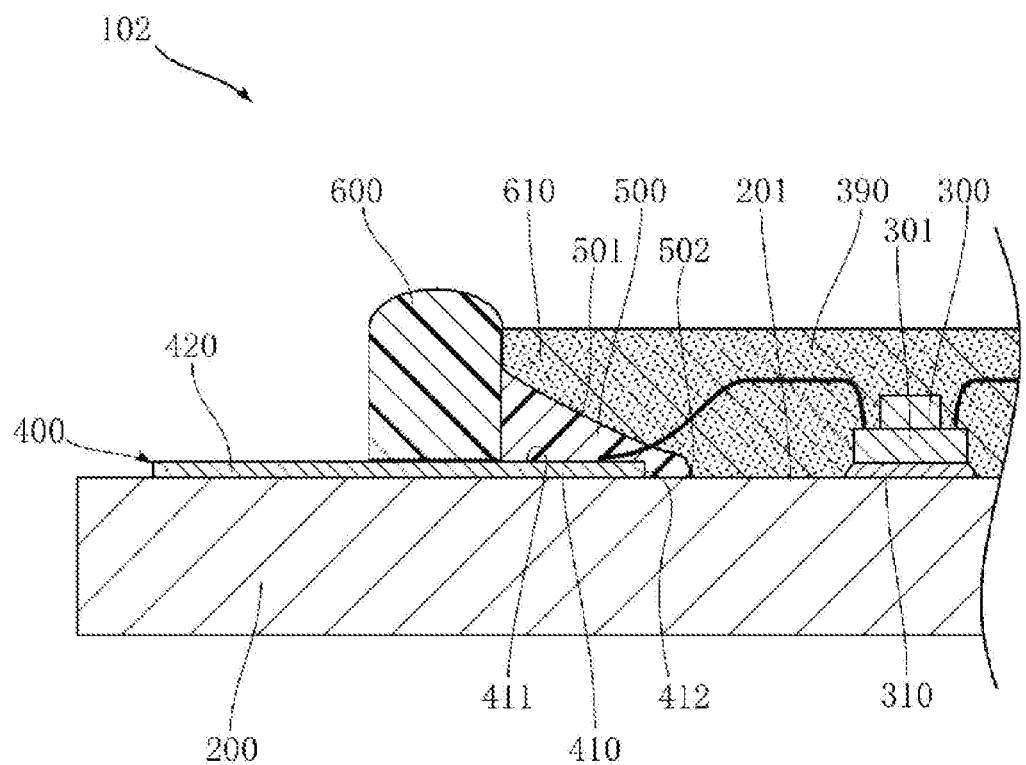
FIG. 7 is an enlarged sectional view showing main parts of an LED lighting apparatus according to a second embodiment of the present disclosure.
Figure 8:
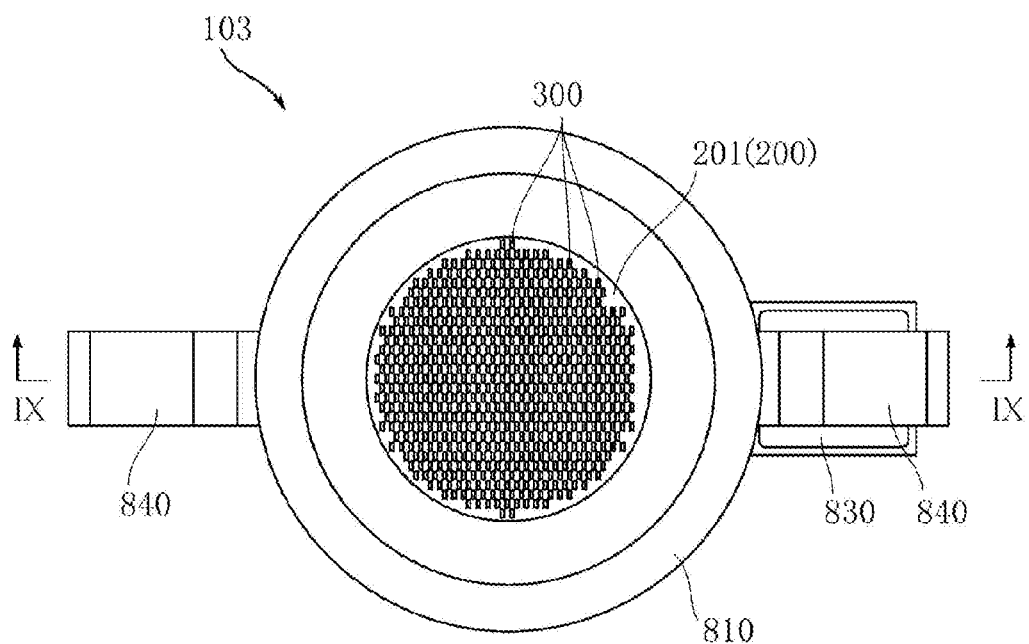
FIG. 8 is a plan view showing an LED lighting apparatus according to a third embodiment of the present disclosure.

FIG. 7 shows an LED lighting apparatus 102 according to a second embodiment of the present disclosure. In the LED lighting apparatus 102 of this embodiment, the LED chips 300 are mounted on their respective sub-mount substrate 301. With this configuration, a light emitting layer of each LED chip 300 is arranged at a position separated from the principal surface 201. The edge 502 of the protective layer 500 may be configured to contact with the sub-mount substrate 301.

According to the second embodiment, high brightness of the LED lighting apparatus 102 can be achieved. The sub-mount substrate 301 disposed between the principal surface 201 and the LED chip 300 is not self-emissive. Therefore, even if liquid or paste resin material used to form the protective layer 500 is leaked and comes into contact with the sub-mount substrate 301, it is less likely to inhibit the emission of the LED chip 300.

FIGS. 8 to 12 show an LED lighting apparatus 103 according to a third embodiment of the present disclosure. The LED lighting apparatus 103 of this embodiment includes a reflector 810, a housing 820, a connector 830 and a holder 840 and is configured as a down-light installed in an opening of a ceiling of a building (not shown), for example.

Figure 9:
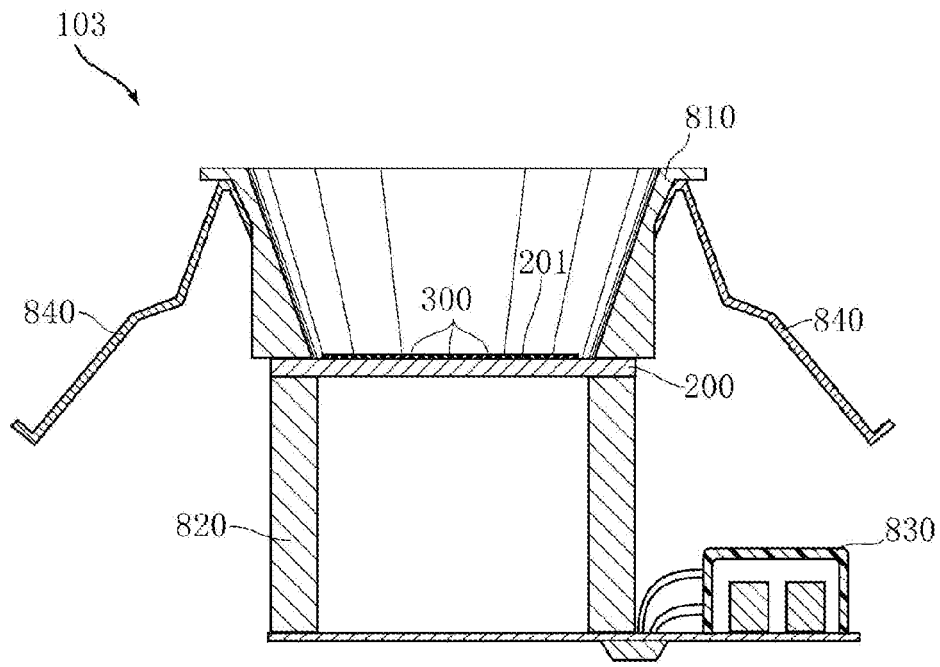
FIG. 9 is a sectional view taken along line IX-IX in FIG. 8.

The reflector 810 is opened in a vertical direction and is attached with the board 200 to block one side of the reflector 810, as shown in FIG. 9. The inner side of the reflector 810 has a cone shape whose sectional dimension increases as it becomes far away from the board 200. The reflector 810 is made of, for example, aluminum.

The housing 820 is provided on the opposite side of the reflector 810 relative to the board 200. The housing 820 is made of, for example, aluminum and, in this embodiment, has a cylindrical or prismatic shape.

The connector 830 is connected to a connector (not shown) at the side of the building when the LED lighting apparatus 103 is attached to the ceiling. The holder 840 is formed by bending a stainless (SUS301) plate, for example. The holder 840 holds the LED lighting apparatus 103 by engaging a portion of the ceiling when the LED lighting apparatus 103 is attached to the ceiling.

Figure 10:
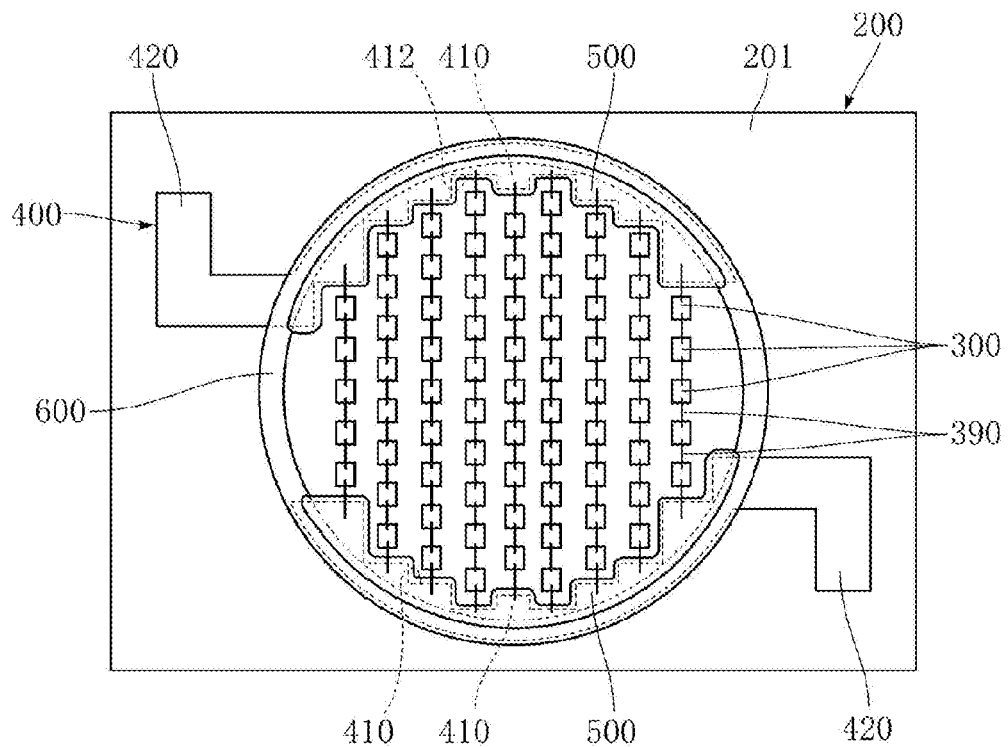
FIG. 10 is a plan view showing main parts of the LED lighting apparatus of FIG. 8.

As shown in FIG. 10, in this embodiment, the board 200 is of a rectangular shape and has a circular frame-like bank 600. The connector or a cable extending from a power supply (not shown) is soldered to the two terminals 420. In this embodiment, the pads 410 have a circular arc shape as it is formed along the bank 600 of a circular frame shape.

Figure 11:
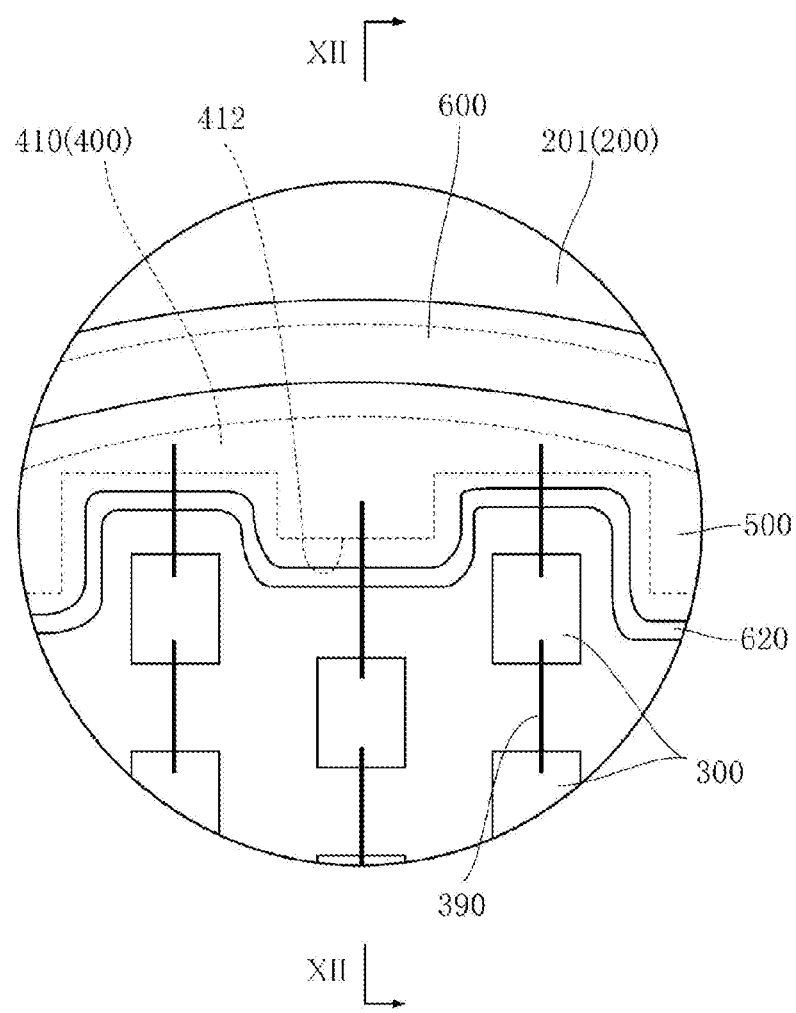
FIG. 11 is an enlarged plan view showing main parts of the LED lighting apparatus of FIG. 8.

The LED chips 300 are arranged in multiple rows on the principal surface 201. As shown in FIGS. 10 and 11, the end surface 312 of the pads 410 has a stepped shape along the arrangement of the LED chips 300.

Figure 12:
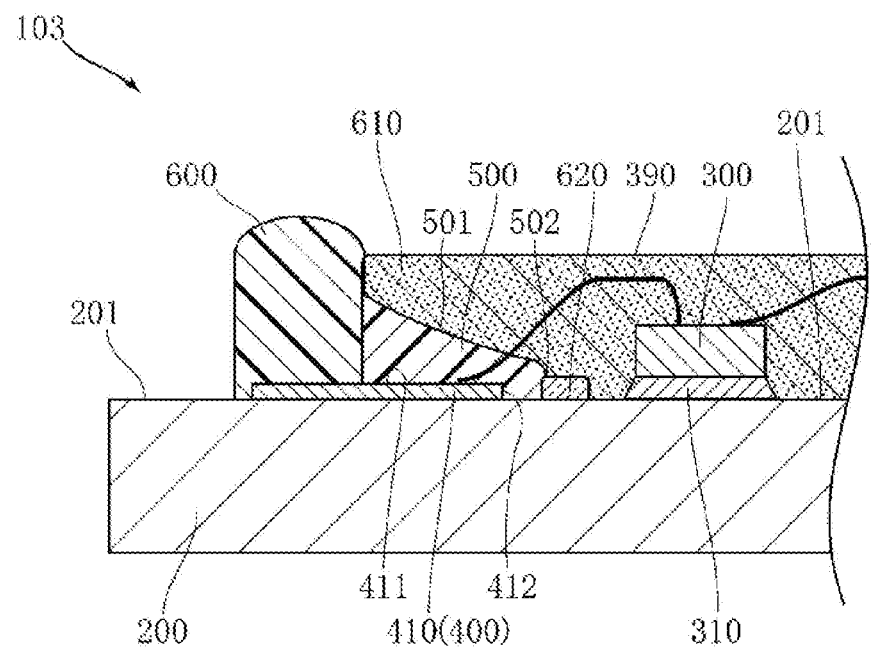
FIG. 12 is a main part enlarged sectional view taken along line XII-XII in FIG. 11.

As shown in FIGS. 11 and 12, the LED lighting apparatus 103 includes a glass layer 620 which is formed on the principal surface 201 of the board 200 and is interposed between the LED chips 300 and the pads 410. The glass layer 620 is separated from the end surface 412 of the pads 410 and has a stepped shape along the end surface 412. The thickness of the glass layer 620 is, for example, 30 to 50 µm.

The protective layer 500 is made of the same material as the above-described LED lighting apparatuses 101 and 102. In this embodiment, an edge 502 of the protective layer 500 overlaps with the glass layer 620. In a process of manufacturing the LED lighting apparatus 103, the wiring pattern 400, the glass layer 620 and the bank 600 are formed on the principal surface 201 of the board 200. The glass layer 620 is formed, for example, by printing and firing liquid or paste glass material. Thereafter, connection of the LED chips 300 and bonding of the wires 390 are performed. Then, the above-described liquid or paste resin material is applied along the bank 600. In this case, if the resin material is spread from the bank 600, the resin material may be blocked by the glass layer 620. The protective layer 500 is formed, for example, by firing this resin material. Through this manufacturing process, the edge 502 of the protective layer 500 overlaps with the glass layer 620.

According to this embodiment, high brightness of the LED lighting apparatus 103 can also be achieved. In addition, the glass layer 620 can prevent the liquid or paste resin material from being leaked out of an intended region when the protective layer 500 is formed. In particular, in many cases, the LED lighting apparatus 103 configured as a down-light may require even higher brightness. To meet this requirement, for example, there is a need to mount the LED chips 300 with high density. Reliable formation of the protective layer 500 in the intended region is advantageous for high-density mounting of the LED chips 300.

Figure 13:
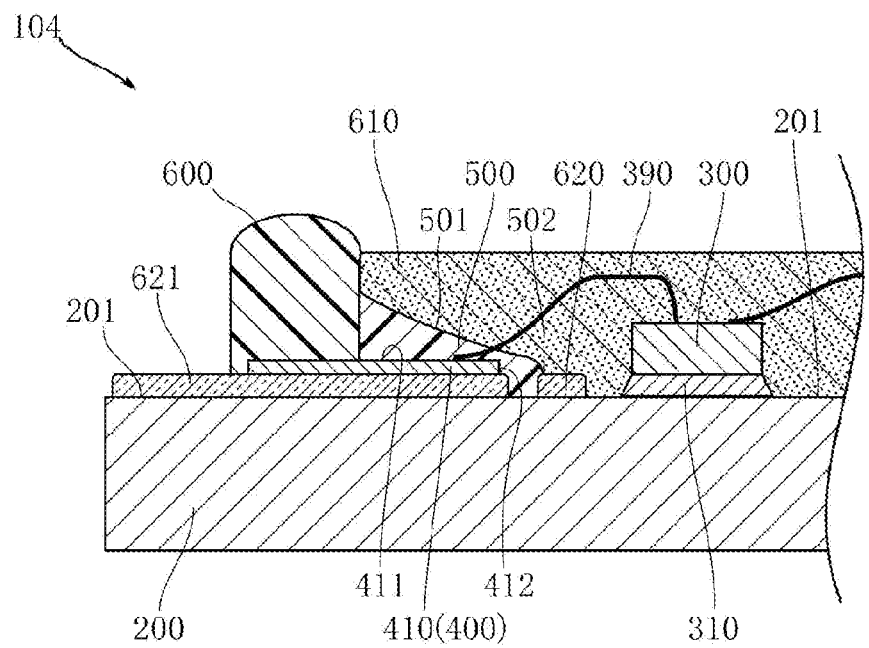
FIG. 13 is an enlarged sectional view showing main parts of an LED lighting apparatus according to a fourth embodiment of the present disclosure.

FIG. 13 shows an LED lighting apparatus 104 according to a fourth embodiment of the present disclosure. The LED lighting apparatus 104 of this embodiment is configured as a down-light, like the LED lighting apparatus 103. In the LED lighting apparatus 104, the board 200 is made of metal such as aluminum. A glass layer 621 is formed on the principal surface 201 of the board 200. The glass layer 621 is interposed between the principal surface 201 and the entire region of the wiring pattern 400 and serves to insulate the wiring pattern 400 from the board 200. The glass layer 621 is formed by the same process as forming the above-described glass layer 620.

This embodiment can also provide high brightness of the LED lighting apparatus 104. The board 200 made of aluminum has a relatively high heat conductivity. Therefore, it is possible to provide better heat dissipation from the LED chips 300. The glass layer 620 may be formed in the same process as the glass layer 621 essential for providing the wiring pattern 400. As such, according to this embodiment, it is possible to provide an uncomplicated manufacturing process of the LED lighting apparatus 104.

Figure 14:
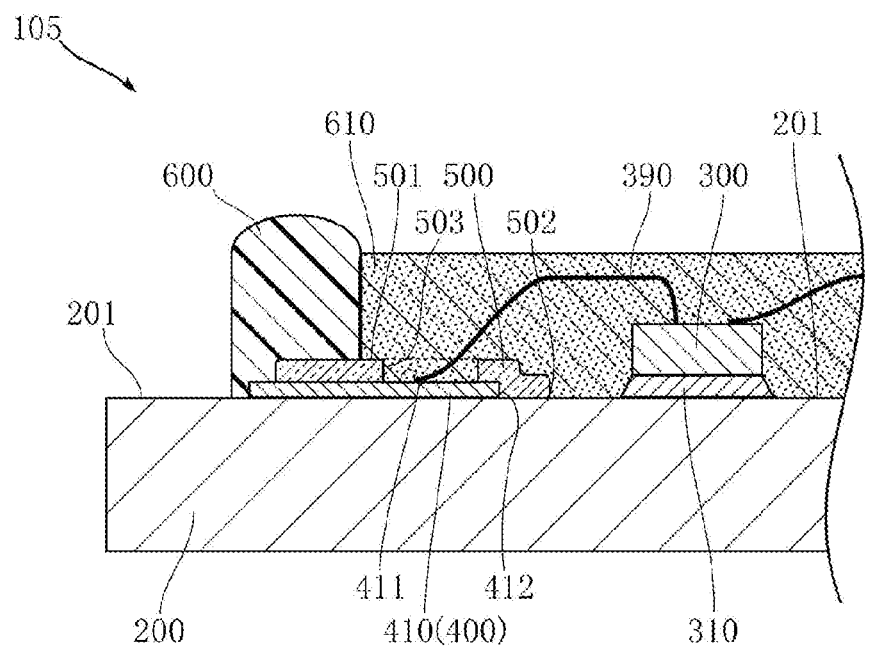
FIG. 14 is an enlarged sectional view showing main parts of an LED lighting apparatus according to a fifth embodiment of the present disclosure.

FIG. 14 shows an LED lighting apparatus 105 according to a fifth embodiment of the present disclosure. The LED lighting apparatus 105 of this embodiment includes a protective layer 500 made of glass. In this embodiment, the protective layer 500 has a portion interposed between the bank 600 and the pads 410 of the wiring pattern 400. In addition, the protective layer 500 has a plurality of openings 503. Each opening 503 is provided to bond the wire 390 to the pads 410. In the manufacturing process of the LED lighting apparatus 105, the protective layer 500 is formed by firing printed glass material, for example after forming the wiring pattern 400 on the board 200. Subsequently, the bank 600 is formed. Then, connection of the LED chips 300 and bonding of the wires 390 are performed. This embodiment can also provide high brightness of the LED lighting apparatus 105.

Figure 15:
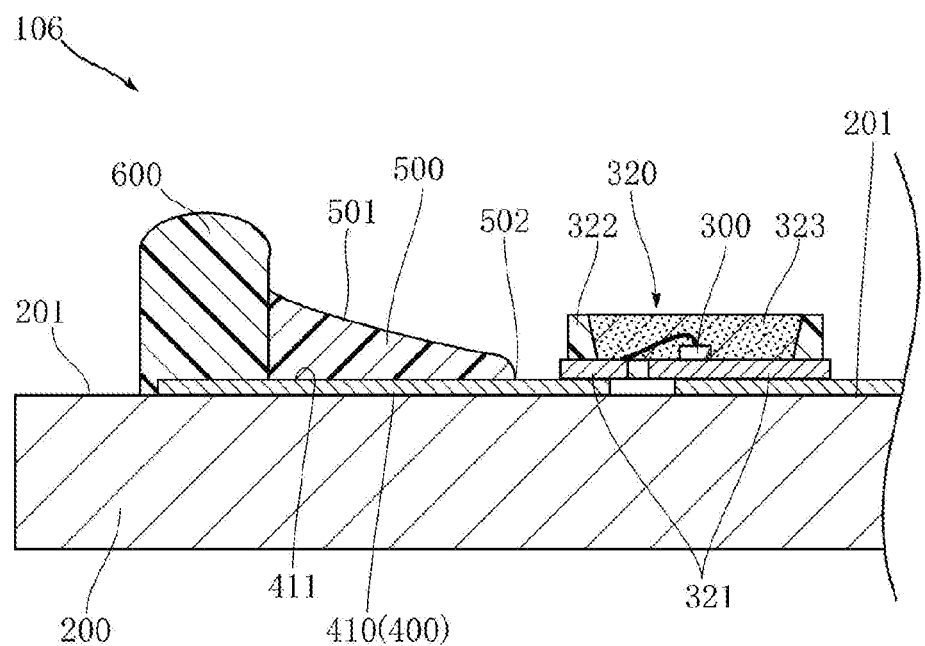
FIG. 15 is an enlarged sectional view showing main parts of an LED lighting apparatus according to a sixth embodiment of the present disclosure.

FIG. 15 shows an LED lighting apparatus 106 according to a sixth embodiment of the present disclosure. The LED lighting apparatus 106 of this embodiment includes a plurality of LED modules 320. Each LED module 320 is configured to include an LED chip 300, two mounting terminals 321, a reflector 322 and a fluorescent resin 323. This configuration is one example of the LED module 320. The LED module 320 may have other configurations if the LED module 320 is configured as a mountable module. The two mounting terminals 321 are made of, for example, Cu and the LED chip 300 is mounted on one of the two mounting terminals 321. The LED chip 300 is configured as a so-called one-wire type, but may be a so-called flip-chip type or two-wire type. The reflector 322 is made of, for example, white resin and surrounds the LED chip 300. The fluorescent resin 323 is filled in a space surrounded by the reflector 322 and covers the LED chip 300. The fluorescent resin 323 is made of, for example, the same material as the above-described sealing resin 610.

The board 200 is made of, for example, ceramics. In the region surrounded by the bank 600, in addition to the pads 410, the wiring pattern 400 includes a plurality of pieces for mounting of the LED module 320. In this embodiment, white light can be obtained even by omitting the sealing resin 610.

This embodiment can also provide high brightness of the LED lighting apparatus 106. The LED module 320 has its own reflector 322. Thus, it is possible to emit more light from the LED chip 300 out of the LED lighting apparatus 106.

Figure 16:
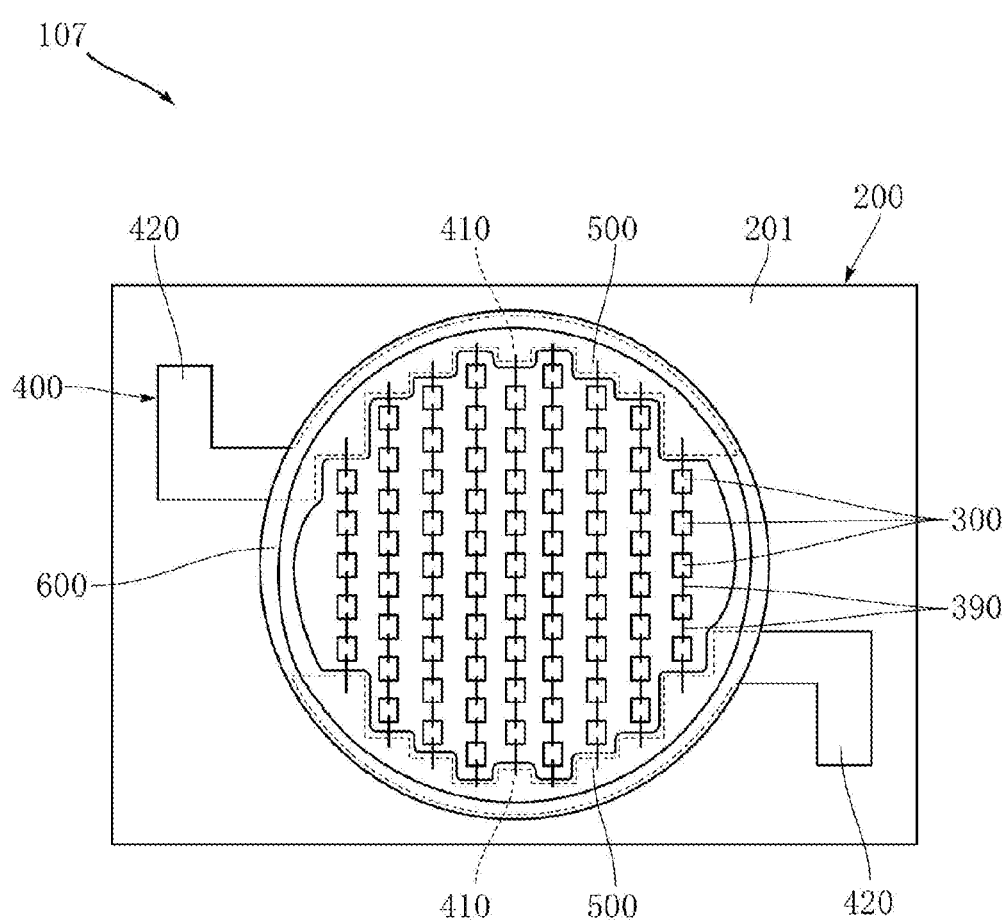
FIG. 16 is an enlarged plan view showing main parts of an LED lighting apparatus according to a seventh embodiment of the present disclosure.

FIG. 16 shows an LED lighting apparatus 107 according to a seventh embodiment of the present disclosure. The LED lighting apparatus 107 of this embodiment includes a protective layer 500 formed over the entire periphery along the bank 600. The other configuration is the same as those of the LED lighting apparatuses 103 to 106. This embodiment can also provide high brightness of the LED lighting apparatus 107.

The LED lighting apparatus according to the above exemplary embodiments of the present disclosure is not intended to be limited to the disclosed embodiments. The specific structure of each part of the LED lighting apparatus may be varied in design in various ways.

Although it has been illustrated in the above that the LED lighting apparatuses 101 and 102 are configured as a substitution for light bulbs and the LED lighting apparatuses 103 to 107 are configured as a down-light, the configurations of the board 200, the LED chips 300, the LED modules 320, the wiring pattern 400, the protective layer 500, the bank 600, the glass layers 620 and 621 and the sealing resin 610 are not limited to the exemplary embodiments but may be suitably applied in different embodiments.

With the above configuration, a portion of the pads of the wiring pattern in the region surrounded by the bank is covered with the protective layer. With this configuration, it is possible to prevent the pads from being damaged due to oxidation or sulfurization. Therefore, it is possible to prevent light from the LED chips being absorbed in the pads, thereby providing high brightness of the LED lighting apparatus.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED (Light Emitting Diode) lighting apparatus comprising:
   a substrate having a first surface;
   at least one connection body formed by a plurality of LED chips arranged side by side in a first direction over the first surface;
   a circular protruding portion arranged over the first surface of the substrate, and surrounding the plurality of LED chips in a plan view seen from a direction perpendicular to the first surface of the substrate;
   a first wiring pattern arranged over the first surface of the substrate, and including:
   a first conduction part positioned outside the circular protruding portion,
   a second conduction part overlapping with the circular protruding portion, and
   a third conduction part positioned in a region surrounded by the circular protruding portion, when seen in the plan view; and
   a second wiring pattern arranged over the first surface of the substrate and spaced apart from the first wiring pattern, the second wiring pattern including:
   a fourth conduction part positioned outside the circular protruding portion,
   a fifth conduction part overlapping with the circular protruding portion, and
   a sixth conduction part positioned in the region surrounded by the circular protruding portion, when seen in the plan view,
   wherein the first conduction part of the first wiring pattern has a portion extending in the first direction, when seen in the plan view,
   wherein the fourth conduction part of the second wiring pattern has a portion extending in a direction opposite to the first direction, when seen in the plan view,
   wherein the first conduction part of the first wiring pattern and the fourth conduction part of the second wiring pattern are spaced apart from each other, when seen in the first direction and when seen in a second direction intersecting the first direction, and
   wherein the third conduction part of the first wiring pattern and the sixth conduction part of the second wiring pattern are formed directly on the first surface of the substrate.

2. The LED lighting apparatus of claim 1, wherein the second conduction part of the first wiring pattern and the fifth conduction part of the second wiring pattern are spaced apart from each other, when seen in the first direction and when seen in the second direction.

3. The LED lighting apparatus of claim 1, wherein the third conduction part of the first wiring pattern and the sixth conduction part of the second wiring pattern overlap each other when seen in the first direction, and are spaced apart from each other when seen in the second direction.

4. The LED lighting apparatus of claim 1, wherein the third conduction part has a bent portion, and the sixth conduction part has a bent portion.

5. The LED lighting apparatus of claim 1, wherein the substrate has a first side parallel to the first direction and a second side intersecting the first side, when seen in the plan view.

6. The LED lighting apparatus of claim 1, wherein the plurality of LED chips includes a first LED chip connected to the first conduction part via a first wire and a second LED chip connected to the first LED chip via a second wire.

7. The LED lighting apparatus of claim 1, wherein the third conduction part of the first wiring pattern is located opposite the sixth conduction part of the second wiring pattern, with the plurality of LED chips interposed between the third conduction part and the sixth conduction part, when seen in the plan view.

8. The LED lighting apparatus of claim 1, wherein the first conduction part of the first wiring pattern and the fourth conduction part of the second wiring pattern are separated by the circular protruding portion when seen in the plan view.

9. The LED lighting apparatus of claim 1, wherein the second conduction part of the first wiring pattern is located between the first conduction part and the third conduction part, and wherein the fifth conduction part of the second wiring pattern is located between the fourth conduction part and the sixth conduction part.

10. The LED lighting apparatus of claim 1, wherein the first, the second, and the third conduction parts of the first wiring pattern are formed in a single body, and the fourth, the fifth, and the sixth conduction parts of the second wiring pattern are formed in a single body.

11. The LED lighting apparatus of claim 1, wherein the at least one connection body includes two or more connection bodies arranged in a plurality of rows over the first surface of the substrate.

12. The LED lighting apparatus of claim 11, wherein the plurality of rows is arranged side by side in the second direction.

13. The LED lighting apparatus of claim 1, wherein the third conduction part of the first wiring pattern and the sixth conduction part of the second wiring pattern are connected to the at least one connection body via wires.

\* \* \* \* \*